United States Patent [19]

McGuire, III

[11] Patent Number: 4,593,200

[45] Date of Patent: Jun. 3, 1986

[54] SCAN CONTROLLER FOR ION IMPLANTER DEVICE

[76] Inventor: Edward L. McGuire, III, 100 N. Winchester Blvd., Suite 260, San Jose, Calif. 95128

[21] Appl. No.: 586,803

[22] Filed: Mar. 6, 1984

[51] Int. Cl.$^4$ .......................................... H01J 37/256
[52] U.S. Cl. ................................ 250/492.2; 250/358
[58] Field of Search ............... 250/492.2, 398, 396 R; 313/359.1, 361.1

[56] References Cited

U.S. PATENT DOCUMENTS

| | | | |
|---|---|---|---|
| 3,688,203 | 8/1972 | Harrison | 250/492.2 |
| 3,932,817 | 1/1976 | Rogers . | |
| 4,013,262 | 3/1977 | Schott et al. | 250/492.2 |
| 4,144,579 | 3/1979 | Nossen et al. . | |
| 4,283,631 | 8/1981 | Turner . | |

OTHER PUBLICATIONS

Edwin J. Rogers, "Optimal Selection of Scanning Frequencies in Ion Implantation Systems with X-Y" 3rd Internat'l Conf. on Ion Implantation Equip. and Tech., Kingston, Canada, Jul. 1980.

N. Turner, "Improved Uniformity of Implanted Dose by a Compensated Scan Pattern Generator" in-house unpublished paper, Varian Associates, Extrion Division, Blackburn Industrial Park, Glouchester, Massachusetts 01930.

Primary Examiner—Bruce C. Anderson
Attorney, Agent, or Firm—Fliesler, Dubb, Meyer & Lovejoy

[57] ABSTRACT

A scan controller 14 for directing an ion beam 152 from an ion implanter device 142 onto a wafer 148 includes a generator 10, 12 for generating first and second signals for guiding the ion beam along two separate axes plus a compensator 28, 72 for compensating the signal so that the speed of the impact point of the ion beam 152 on the wafer 148 is substantially constant as the ion beam 152 scans across the wafer 148 to obtain a substantially even distribution of ions on the wafer 148 along the path of the ion beam 152.

23 Claims, 6 Drawing Figures

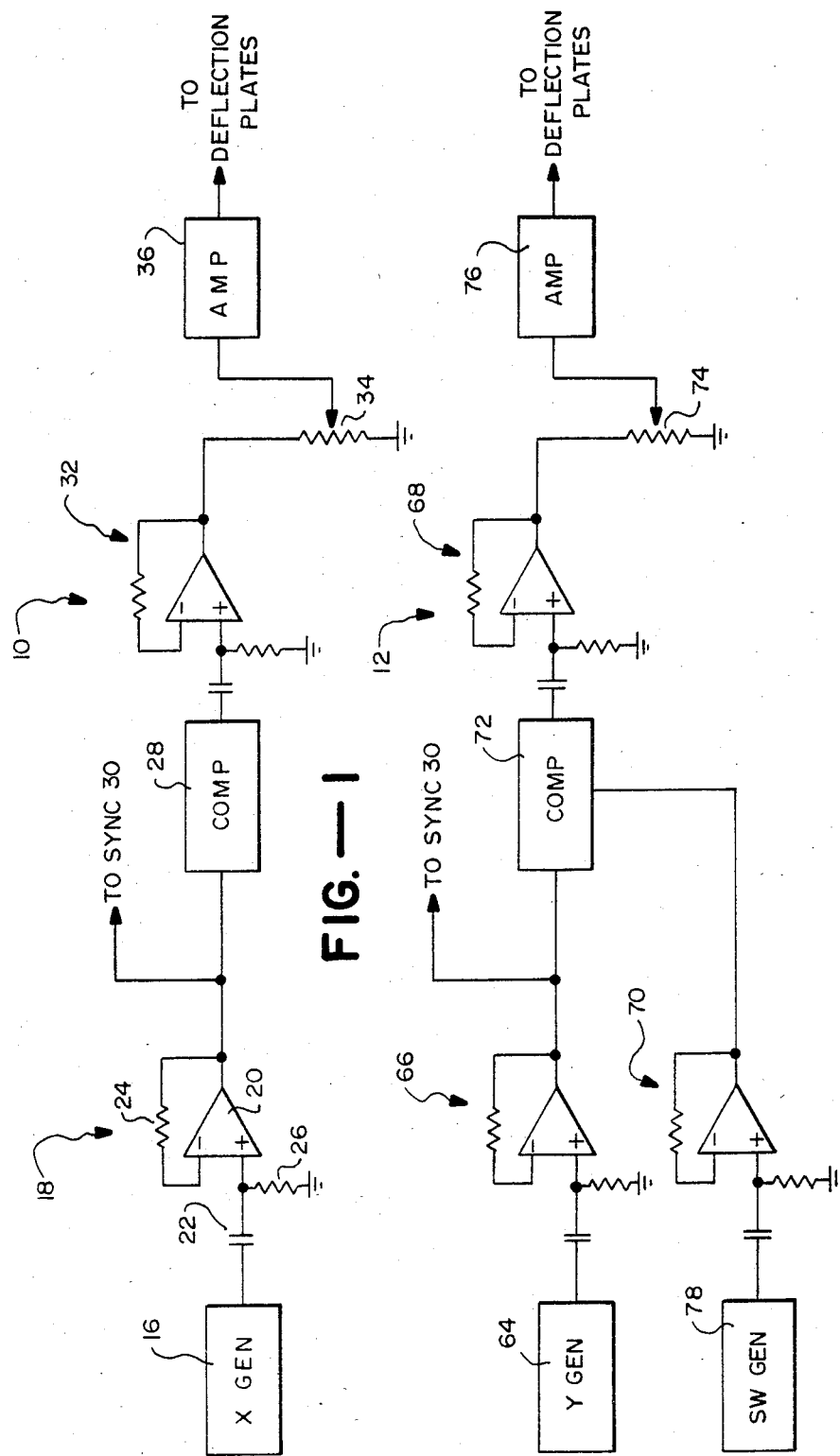
FIG.—1
FIG.—2

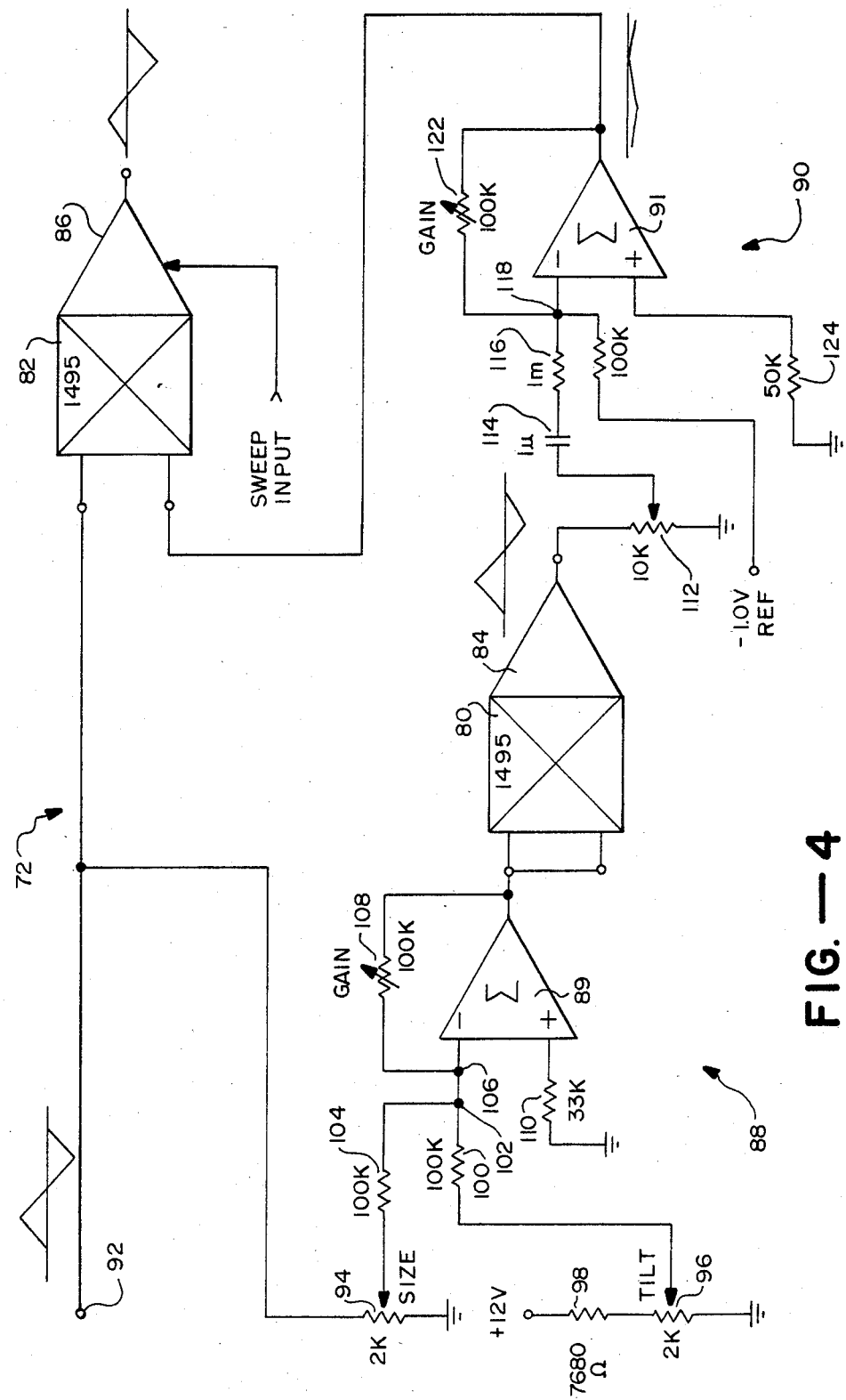
FIG.—4

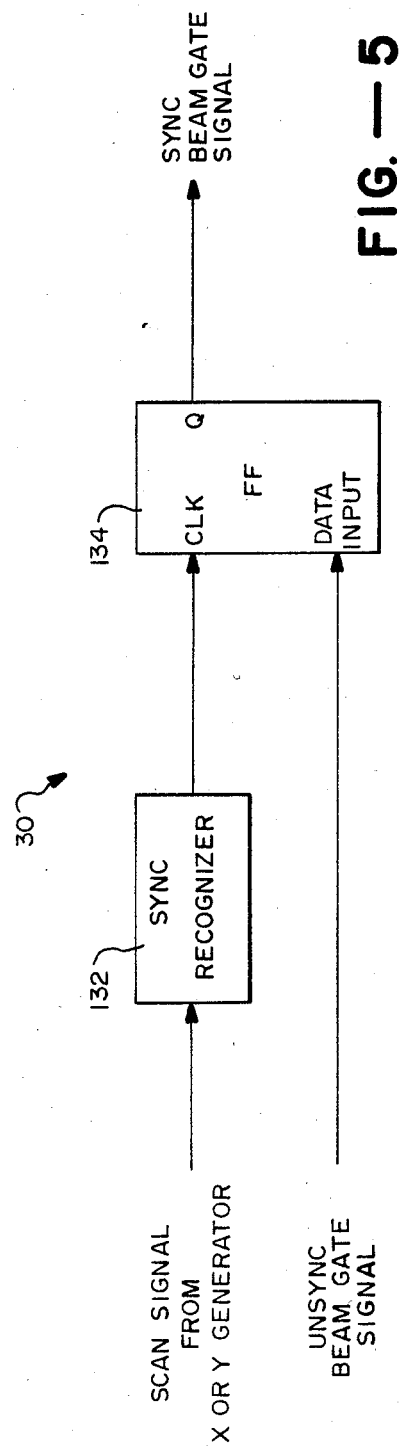
FIG.—5
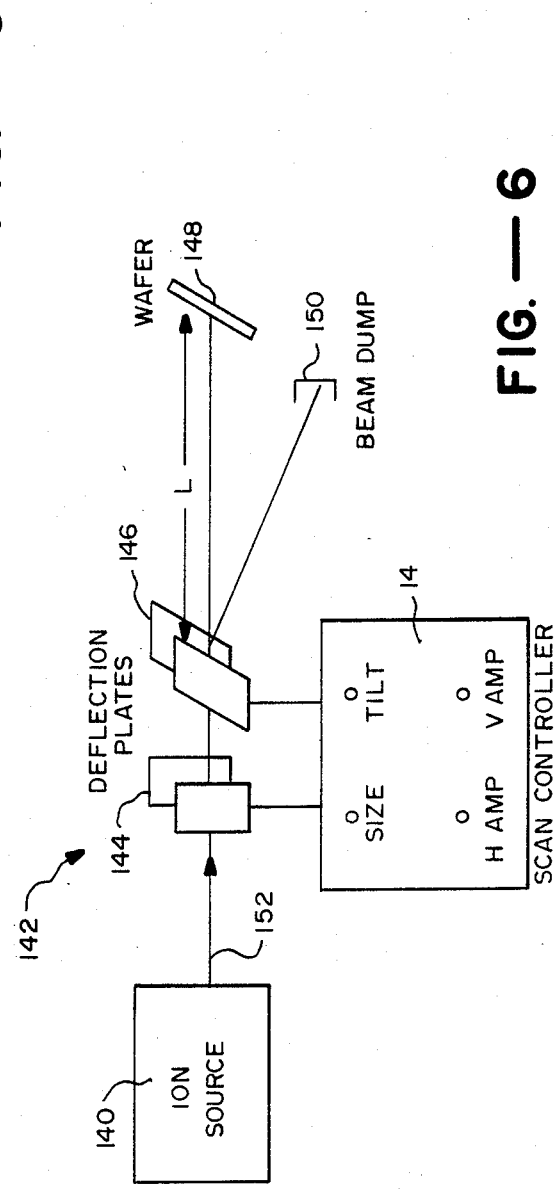
FIG.—6

SCAN CONTROLLER FOR ION IMPLANTER DEVICE

TECHNICAL FIELD

The present invention relates to the implantation of doping ions into semiconductor wafer substrates, and in particular, to a scan controller for directing a beam of ions selectively at the wafer.

BACKGROUND ART

In order to alter the electrical properties of semiconductor wafers, selected ions, such as arsenic, boron, or phosphorous ions, are used to dope the wafers. At first this doping was accomplished through the placement of trays of semiconductor wafers in diffusion furnaces. This arrangement, while at one time satisfactory, is not acceptable for today's increasingly smaller circuitry, as the deposition uniformities are not great enough.

Diffusion furnaces were replaced by ion implanters, which cause a beam of ions to be directed toward and impact upon a wafer in order to uniformly deposit ions on or in the surface of the wafer. Basically, these ion implanters include a source which generates a beam of ions to be implanted, which ion beam is passed through two perpendicular deflection systems, electrostatic or magnetic, to deflect the ion beam as required onto the wafer. A scan controller produces signals which control the charge placed on the deflection plates to provide a distribution of ions across the wafer much as an electron beam is selectively deflected to scan across the screen of a television set. Levels of non-uniformity of about one percent are presently possible with such a device.

This measure of non-uniformity is due, in part, to the prior lack of appreciation of the physical geometry of the ion beam striking the wafer. If the beam is exactly perpendicular to the center of the wafer, then as it progresses to the extremes of the wafer, the beam loses its perpendicular relationship. And as the angular speed of the beam is constant, the linear speed of the beam relative to the wafer as the beam is swept to the extremities increases This increase in speed causes fewer ions to be deposited at the extremities than at the center. Prior devices have attempted to solve this problem by placing a series of discrete step functions in the controller in order to slow the speed of the beam as it reaches the extremities of the wafer. This discreteness, by its very nature, leads to non-uniformities.

Another geometrical consideration which has not been fully appreciated is the fact that the wafer is generally tilted at an angle of about seven degrees from a plane which is perpendicular to the ion beam in order to prevent channeling of the ions through the wafer. Due to this tilted orientation the ions are trapped at the surface of the wafer. Quite naturally this tilted orientation means that there is another factor which will cause the beam to not travel at a uniform linear speed across the surface of the wafer.

Prior art devices additionally do not accurately control the beginning and ending of the ion beam scanning of a wafer. In fact, in order to come out to a one percent non-uniformity, the standard of the industry is to have approximately 100 scans of each wafer. Thus if the beginning of the first scan and/or the ending of the last scan lie partially through the wafer, the error falls within the one percent. Additionally beam walkover occurs when the ion beam is directed from an ion beam dump across the wafer to begin a scan at a position other than at the edge of the wafer. Ions are thus deposited in a non-uniform manner. Beam walkover can quite naturally occur when the ion beam is directed from a partially completed final scan back to the beam dump.

Further, prior commercial devices, due to improper selection of the frequencies which operate the two pairs of deflection systems, have a tendency to have scan lock wherein one frequency locks to the other, and thus there is striping of the doping on the wafer. These stripes are actually bands of heavier-than-average ion doping. These stripes of course affect the semiconducting properties of the chips which are eventually cut from the wafer. The ratio of the actually selected frequencies has been reported to be from 9 to 1, to 37 to 1. This selection causes small angled polygons to be formed in the ion pattern which causes excessive overscan of the wafer. Further this frequency selection, coupled with the fact that the ion beams are not stable in intensity, does not allow irregularities to be smoothed out well enough for the axis having the slower frequency.

Further, in order to more uniformly cover the wafer, prior devices have stepped the pattern described by the ion beam through a series of discrete positions in order to provide a more uniform application of ions to the wafer. This discrete approach by its very nature fails to eliminate non-uniformities.

As the above doping non-uniformities are not acceptable to many present day applications such as, for example, in high density gate array or memory chips, video cameras, microwave transistors, and A/D and D/A converters, the present invention is directed to overcoming the disadvantages of the prior art.

SUMMARY OF THE INVENTION

In one aspect of the present invention, a scan controller for directing an ion beam from an ion implanter device onto a target comprises means for generating a first signal for guiding the ion beam along on one axis and means for generating a second signal for simultaneously guiding the ion beam along another axis. The scan controller further includes first means for continuously compensating at least one of the first and second signals so that the speed of the point of impact of the ion beam on the target is substantially constant to obtain a substantially even distribution of ions on the target no matter what the size of the wafer is.

In another aspect of the invention where the target is tilted relative to the ion beam, the scan controller further comprises a second means for continuously compensating one of the first and the second signals for the tilt of the target so that the speed of the point of impact of the ion beam on the target is substantially constant.

In yet another aspect of the invention, the first means can include a continuous analog waveform compensation circuit.

In still a further aspect of the invention, the analog compensation circuit quadratically compensates at least one of the first and second signal.

In another aspect of the invention, means are provided for avoiding incomplete ion beam scans of the target and beam walkover on the target due to the non-synchronization of the scanning to the commands to begin or end scan which moves the ion beam to or from an ion beam dump to the target.

Another aspect of the invention is the use of an analog sweep device to continuously sweep an ion implant pattern across the target, and the selection of substantially equal, but not identical frequencies for the first and second signals. Both of these aspects provide for more uniform ion deposition.

A further aspect of the invention includes a voltage follower for preventing DC drift.

From the above it can be seen that the present invention provides for a scan controller which can provide for a uniform distribution of ions on the wafer by accounting for both the size of the wafer and the tilt angle of the wafer relative to the ion beam. Also in combination with this compensation, the scan controller provides for substantially equal but not identical first and second signals and also for an analog sweep signal, for increased uniformity over the prior art.

BRIEF DESCRIPTION OF THE FIGURES

FIG. 1 is a schematic view of the circuitry for generating the x axis or horizontal signal for the x axis or horizontal deflection plates of an embodiment of the invention.

FIG. 2 is a schematic view of the y axis or vertical deflection circuitry for generating the y axis or vertical deflection plates of one embodiment of the invention.

FIG. 4 is a schematic of a compensation circuit for the y axis signal generation circuit of an embodiment of the invention.

FIG. 5 is a schematic of the synchronization circuit of an embodiment of the invention.

FIG. 6 is a side view of the wafer ion implant device with an embodiment of the scan controller of the invention.

DETAILED DESCRIPTION OF THE PREFERRED EMBODIMENT

Figure 3:
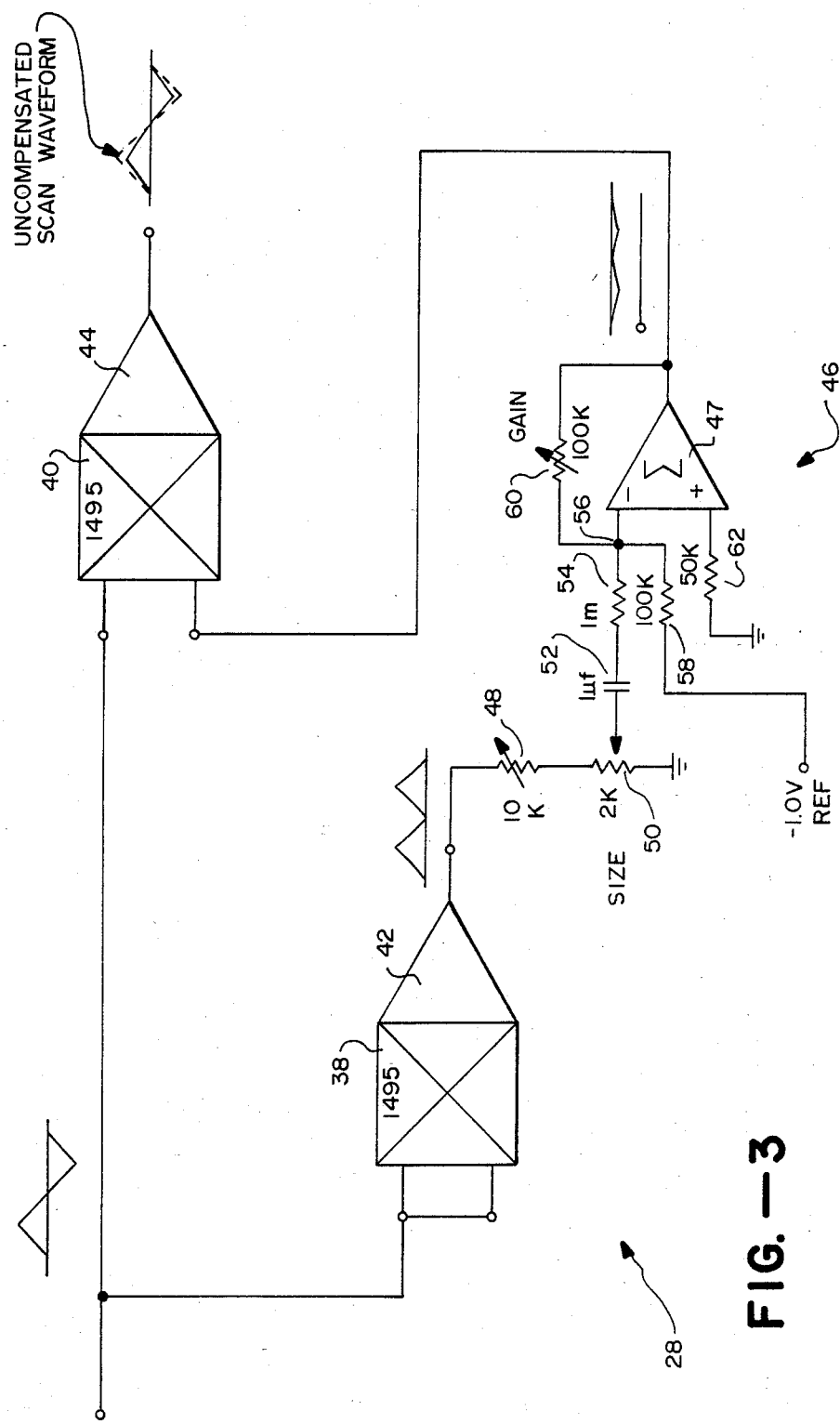
FIG. 3 is a schematic of a compensation circuit for the x axis signal generation circuit of an embodiment of the invention.

With reference to the figures, and in particular FIGS. 1 and 2, the compensated horizontal or x scan signal generator 10 and the compensated vertical or y scan signal generator 12 of the scan controller 14 (FIG. 6) are depicted. The horizontal scan signal generator 10 controls the deflection plates (not shown) which deflect the ion beam emanating from an ion implantation device (not shown) in a horizontal plane so as to change the position where the ion beam strikes a wafer. The vertical scan signal generator 12 controls the vertical deflection plates (not shown) to control the positioning of the ion beam in a vertical plane.

The horizontal scan signal generator 10 includes a stable crystal oscillator which generates a uniform triangle waveform and which is contained in the horizontal signal generator 16. This signal is sent through an AC coupled voltage follower 18. As is discussed below, each of the functional blocks of the horizontal scan signal generator 10 and the vertical scan signal generator 12 are separated by voltage followers such as follower 18. The voltage follower isolates the blocks with regard to DC drift which could affect the correct operation of the generators. As can be seen in FIG. 1, the voltage follower 18 includes an operation amplifier 20 in-line capacitor 22, feedback resistor 24 and pull-down resistor 26. The output from the voltage follower 18 is communicated to the horizontal compensation circuit 28 and to the beam synchronization circuit 30 which is shown in FIG. 5. The horizontal compensation circuit 28 is more fully shown in FIG. 3 and will be discussed hereinbelow.

The signal from the horizontal compensation circuit 28 is communicated to another AC coupled voltage follower 32 which is similar to voltage follower 18. The output from the voltage follower 32 is provided to external operator controlled potentiometer 34 which controls the amplitude of the signal provided to amplifier 36. Amplifier 36 in turn provides a signal to the horizontal deflection plates (not shown). In a preferred embodiment, the horizontal signal generator 16 provides a signal of approximately 500 Hz.

The horizontal compensation circuit 28 (FIG. 3) includes two analog multiplier integrated circuits 38 and 40, which in a preferred embodiment are Motorola MC1495 multipliers which are coupled to amplifiers 42 and 44 respectively and an adder and inverter 46. The signal from horizontal signal generator 16 is provided to both input terminals of multiplier 38 and to a first input terminal of multiplier 40. The multiplier 38 essentially then squares the input and provides it to amplifier 42 and therefrom through internal potentiometer 48 to external potentiometer 50 which potentiometer 50 is used by the operator of the system to make an adjustment, depending on the size or diameter of the wafer to be implanted with ions from the ion beam.

As will be described more fully, the speed of travel of the ion beam across the target must be corrected by a factor of one minus the square of the angle that the ion beam has with a perpendicular to the target wafer. The adder and inverter 46 receives a square of the angle from the multiplier 38, through capacitor 52 and resistor 54 at node 56, and also a negative 1-volt reference through resistor 58 at node 56. This sum is then received and inverted by the inverting terminal of amplifier 47 of adder and inverter 46 to provide a positive value which is supplied to the second terminal of multiplier 40 and multiplied by the signal generated by horizontal signal generator 16 to provide a compensated signal for directing the ion beam along the horizontal axis at a constant speed. Potentiometer 60 adjusts the gain of amplifier 47, and the non-inverting terminal is tied to ground through resistor 62.

The compensated vertical scan signal generator 12 in FIG. 2 is similar to the compensated horizontal scan signal generator 10 in FIG. 1. The generator in FIG. 2 includes a vertical or y axis signal generator 64, voltage followers 66, 68 and 70 which are similar to voltage follower 18, a vertical compensation circuit 72 which is similar to circuit 28 and which will be described hereinbelow. Further, the generator 12 includes external potentiometer 74 for adjusting the amplitude of the vertical compensated signal and amplifier 76 which communicates with the deflection plates for appropriately deflecting the ion beam in the vertical plane. As will be discussed below, an analog sweep signal is provided by the sweep generator 78, which signal is communicated from generator 78 to compensation circuit 72. This adds an analog signal to the signal provided by compensator 72 so that the ion pattern described on the wafer is swept continuously and uniformly back and forth across the wafer to give a more uniform ion distribution.

In FIG. 4, the vertical compensation circuit 72 is depicted and includes analog multiplier integrated circuits or multipliers 80 and 82 which have their output amplified by amplifiers 84 and 86 and also adder and inverter 88 and adder and inverter 90. A uniform triangle waveform from vertical signal generator 64 is provided through voltage follower 66 to line 92 of the compensation circuit 72. Therefrom a signal is provided to a first input of multiplier 82 and to external potentiometer 94 which is adjusted according to the diameter of the wafer. External potentiometer 96 provides for an adjustment depending on the tilt of the wafer. Potentiometer 96 is communicated through resistor 98 by a 12-volt power supply. The signal therefrom is communicated through resistor 100 to node 102, which also receives the signal from external wafer-size potentiometer 94 through resistor 104. The combined signal from node 102 is communicated to node 106 which is in communication with the gain adjusting potentiometer 108 for the amplifier 89 of adder 88. Amplifier 89 has gain control potentiometer 108, and the non-inverting terminal is connected to ground by resistor 110. The output from amplifier 89 is provided to both inputs of analog multiplier 80 and is squared thereby and amplified by amplifier 84 and provided through internal potentiometer 112 through capacitor 114 and resistor 116 to node 118 which communicates with the inverting terminal of amplifier 91. A negative 1-volt reference is provided to node 118 through resistor 120 where it is combined with the signal from multiplier 80. Additionally, gain control potentiometer 122 communicates between the output of amplifier 91 and node 118. The non-inverting terminal of amplifier 91 is communicated to ground through resistor 124. Accordingly the signal from multiplier 80 is added to a negative one volt and inverted to provide a signal to the second terminal of multiplier 82. Multiplier 82 then multiplies this signal with the signal generated by the vertical signal generator 64 to provide a compensated signal which is amplified by amplifier 86. Amplifier 86 additionally adds to the signal the analog sweep signal of sweep generator 78 to provide the total vertical compensated signal for controlling the vertical deflection system.

Turning to FIG. 5, the synchronization circuit 30 of the scan controller 14 is depicted. This circuit is provided so as to synchronize a beam gate signal, which controls the deflection of the ion beam to the beam dump, to the appropriate scan signal generator voltage follower 18 or 66. In practice only one synchronization circuit is used with either generator 10 or 12, although each generator can have its own synchronization circuit. The synchronizer synchronizes the movement of the ion beam from the beam dump to the wafer when the scan controller is beginning to start the scan of the wafer, and synchronizes the movement of the ion beam to the beam dump when the scan controller is at the end of the scan of the wafer, preparatory to another wafer being positioned in the ion implanter. By so doing, there are no partial scans of the wafer and no beam walkover of the wafer due to the ion beam's being directed completely across the wafer from the point of partial scan to the beam dump.

The synchronization circuit 30 includes a synchronization recognition circuit 132 which senses the appropriate peak of the waveform signal from generator 16 or 64, which peak being an indication that the pattern is at the beginning or end of the sweep and uses this to clock a flip-flop 134. The flip-flop receives an unsynchronized beam gating signal and only allows this signal to propagate through the flip-flop as enabled by the clocking of the flip-flop. Thus a beam gate signal is provided from flip-flop 134 in synchronization with the signal from the generator 16 or 64. Accordingly, non-uniformities due to beam walkover are eliminated.

In FIG. 6 the ion source 140 and ion beam 152 of the ion implanter device 142 are depicted along with horizontal and vertical deflection plates 144, 146. Also depicted are the scan controller 14 and the wafer 148 and beam dump 150.

INDUSTRIAL APPLICABILITY

The reason for the compensation to the scan signal is as follows. In either the horizontal or vertical direction, the beam hits the wafer (assuming there were no tilt) perpendicularly only at the center, and at greater angles on either side. If the angular velocity of the beam were a constant, the linear velocity of the ion beam relative to and across the wafer would not be constant. By simple trigonometry, assuming that the angle described by the beam as it scans the wafer is identified by $\theta$ and x is the distance between the center of the wafer to the location where the beam hits, and L is the perpendicular distance from the source of the beam to the center of the wafer, then the distance x is described as equaling L times the tangent of $\theta$. Taking the derivative of the distance x to calculate the speed of the beam across the wafer:

$$dx/dt = (L) \, d/dt \, (\tan \theta) = L(\sec^2\theta) \, d\theta/dt$$

as:

$$\sec^2\theta = 1 + \tan^2\theta$$

$$dx/dt = L(1 + \tan^2\theta) d\theta/dt$$

where $d\theta/dt$ = the angular velocity of the ion beam.

In order to keep $dx/dt$ a constant:

$$d\theta/dt = \text{varies as } 1/(1 + \tan^2\theta)$$

If $\tan^2\theta$ is much less than 1, then: $d\theta/dt$ varies as $(1 - \tan^2\theta)$ And: if $\tan^2\theta$ is much less than 1, then $\tan^2\theta$ = approx. $\theta^2$, then: $d\theta/dt$ varies as $1 - \theta^2$ Thus a quadratic correction is indicated to provide a constant speed of the beam across the wafer.

For compensation in the vertical direction, it is to be understood that due to the tilt in the vertical direction, the ion beam never comes into contact with the wafer in a perpendicular manner. The wafer is always some distance from a point where the extension of the wafer and the ion beam would form a right angle. The distance away gives rise to a fixed angle $\theta$ which means that when the ion beam first contacts the wafer, it is going somewhat faster than it would go if it were contacting the wafer in a perpendicular manner, and at the end of the sweep it is going much faster than the speed it would be going if it contacted the wafer in the initial perpendicular manner. Accordingly, the above quadratic solution for the compensation for the horizontal signal must be compensated for this fixed angle $\theta$ displacement. Thus a constant signal representing this fixed $\theta$ is added by the tilt potentiometer to the signal from the size potentiometer, and the quantity is squared by multiplier 80.

The result of all these compensations is that in the horizontal direction, the angular speed of the beam is increasingly slowed as the beam scans toward the edge of the wafer so that the linear velocity of the beam across the wafer is constant. In the vertical direction, the tilt compensation is applied as well as a correction similar to the horizontal compensation.

In a preferred embodiment, both generators 10, 12 generate an approximately 500-Hz waveform. Each, however, generates a slightly different frequency, as equal frequencies will draw a rectilinear pattern which does not move or scan the entire wafer. The closer the frequency ratio is to unity, the more closely the pattern intersection angles approach right angles, and the more equidistant the points of intersection become along both scan axes. This gives the highest obtainable uniformity in a single scan frame, and since ion beams are usually not stable in intensity, the highest instantaneous uniformity.

The operation of the invention is as follows. Initially appropriate settings are made on the size potentiometers 50 and 94 to accommodate the diameter of the wafer. Then an appropriate setting is made on tilt potentiometer 96 to accommodate the tilt of the wafer as it is inserted into the ion implanter device. Once this is done, the scan controller 14 can be turned on and the wafer fed into the implanter device. The implanter device then initiates a beam gate signal which releases the ion beam from the dump zone. However, this signal does not act to release the ion beam from the dump zone until the synchronization circuit which is synchronized to the horizontal or vertical generators 10, 12 enables a flip-flop indicating the beginning of the scan, so that beam walkover will not occur. Once it is safe to begin ion implantation, such implantation is accomplished until the implanter provides a beam gate signal to cause the ion beam to be directed to the dump zone. Again, this can only occur when the synchronizer allows this beam gate signal to control the ion beam when the beam is at the end of a scan.

Also it is to be understood that some implanters electrostatically or magnetically control in one plane and mechanically control in a second plane. With such a device, the present invention can be applied to the plane in which the beam is electrostatically or magnetically controlled.

Furthermore, it can be seen that the system of compensation for wafer-size-induced non-uniformity of implant can be adjusted so as to completely compensate for non-uniformities due to non-planar targets, such as caused by convex-curvature wafer chucks, and to provide means for first-order compensation for non-linear deflection system sensitivity.

Other objects and advantages of the invention can be learned from review of the claims and the drawings appended hereto.

I claim:

1. A scan controller for directing an ion beam from an ion implanter device onto a target comprising:
    means for generating a first signal for guiding the ion beam along one axis;
    means for generating a second signal for simultaneously guiding the ion beam along another axis; and
    first means for continuously and quadratically compensating at least one of the first signal and the second signal so that the speed of the point of impact of the ion beam on the target is substantially constant to obtain a substantially even distribution of ions on the target along the path of the beam.

2. The scan controller of claim 1 wherein said first means includes a continuous analog waveform compensation circuit.

3. The scan controller of claim 1 wherein said first means includes means for quadratically compensating at least one of said first and said second signals.

4. The scan controller of claim 1 wherein said target is substantially flat and wherein said first means includes:
    means for compensating at least one of said first and said second signals by substantially a multiple of one minus the square of the angular displacement of the ion beam from a starting point on the wafer.

5. The scan controller of claim 1 including means for avoiding incomplete ion beam scans of the target.

6. The scan controller of claim 1 including:
    means for selectively deflecting the ion beam to a beam dump away from the target;
    means for preventing the deflection of the ion beam during the scan of the target.

7. The scan controller of claim 1 including:
    means for selectively deflecting the ion beam to a beam dump away from the target;
    means for preventing the deflection of the ion beam at a point partially through the scan of the target.

8. The scan controller of claim 6 wherein the deflection preventing means includes:
    a flip-flop for interrupting a beam dump deflection signal, which flip-flop is not clocked when at least one of said first and second signals are partially through the scan of the target.

9. The scan controller of claim 1 wherein said first means includes:
    means for squaring the first signal;
    means for subtracting the squared first signal from a reference;
    means for multiplying the first signal by the result of the subtracting means to arrive at a compensated first signal.

10. The scan controller of claim 9 wherein the target is tilted relative to the ion beam and further comprising:
    means for adding a substantially constant offset to the first signal to compensate for the tilt of the target prior to the squaring of the first signal.

11. The scan controller of claim 1 including:
    means for preventing DC signal drift.

12. The scan controller of claim 11 wherein said means for preventing DC signal drift includes AC coupled voltage followers.

13. The scan controller of claim 1 wherein the first signal and the second signal have substantially the same, but not quite equal frequencies.

14. The scan controller of claim 1 wherein the first and second signals are triangle waveforms.

15. The scan controller of claim 1 including
    means for adding a continuous sweep signal to one of the first and second signals to cause a pattern created on the target by the first and second signals to sweep back and forth across the target.

16. The scan controller of claim 15 wherein:
    the means for adding a continuous sweep signal adds a continuous analog sweep signal.

17. A scan controller for directing an ion beam from an ion implant device onto a target comprising:
    means for generating a first signal for guiding the ion beam along one axis;
    means for generating a second signal for simultaneously guiding the ion beam along another axis wherein the first signal and the second signal have substantially the same, but not quite equal frequencies;

first means for continuously and quadratically compensating the first signal and the second signal so that the speed of the point of impact of the ion beam on the target is substantially constant to obtain a substantially even distribution of ions on the target along the path of the beam; and means for adding a continuous sweep signal to one of the first and second signals to cause a pattern created on the target by the first and second signals to sweep back and forth across the target.

18. A scan controller for appropriately activating first and second pairs of deflection plates for directing an ion beam from an ion implanter device onto a substantially flat target which is tilted, comprising:

means for generating a first signal for activating the first set of deflection plates for guiding the ion beam along one axis;

means for generating a second signal for activating the second set of deflection plates for simultaneously guiding the ion beam along another axis wherein the first signal and the second signal have substantially the same, but not quite equal frequencies;

first means for continuously compensating the first signal and the second signal so that the speed of the point of impact of the ion beam on the target is substantially constant to obtain a substantially even distribution of ions on the target along the path of the beam;

said first means including a second means for continuously compensating one of the first and the second signals for the tilt of the target; and means for adding a continuous sweep signal to one of the first and second signals to cause a pattern created on the target by the first and second signals to sweep back and forth across the target.

19. A scan controller for directing an ion beam from an ion implanter device onto a target comprising:

means for generating a signal for guiding the ion beam; and first means for continuously and quadratically compensating the signal so that the speed of the point of impact of the ion beam on the target is substantially constant to obtain a substantially even distribution of ions on the target along the path of the beam.

20. The scan controller of claim 19 wherein the target is tilted relative to the ion beam and further comprising:

second means for continuously compensating the signal for the tilt of the target so that the speed of the point of impact of the ion beam on the target is substantially constant to obtain a substantially even distribution of ions on the target along the path of the beam.

21. A scan controller for directing an ion beam from an ion implanter device onto a target comprising:

means for generating a signal for guiding the ion beam;

first means for continuously and quadratically compensating the signal so that the speed of the point of impact of the ion beam on the target is substantially constant to obtain a substantially even distribution of ions on the target along the path of the beam; and means for adding a continuous sweep signal to the signal to cause a pattern created on the target to sweep back and forth across the target.

22. A scan controller for directing an ion beam from an ion implanter device onto a target wherein the target is tilted relative to the ion beam comprising:

means for generating a first signal for guiding the ion beam along one axis;

means for generating a second signal for simultaneously guiding the ion beam along another axis;

first means for continuously compensating at least one of the first signal and the second signal so that the speed of the point of impact of the ion beam on the target is substantially constant; and second means for continuously compensating one of the first and the second signals for the tilt of the target so that the speed of the point of impact of the ion beam on the target is substantially constant to obtain a substantially even distribution of ions on the target along the path of the beam.

23. A scan controller for directing an ion beam from an ion implanter device onto a target wherein the target is tilted relative to the ion beam comprising:

means for generating a first signal for guiding the ion beam along one axis;

means for generating a second signal for simultaneously guiding the ion beam along another axis;

first means for continuously compensating both of the first signal and the second signal so that the speed of the point of impact of the ion beam on the target is substantially constant with a first continuous analog waveform compensation circuit for compensating the first signal and a second continuous analog waveform compensation for compensating the second signal; and second means for continuously compensating one of the first and second signals for the tilt of the target so that the speed of the point of impact of the ion beam on the target is substantially constant to obtain a substantially even distribution of ions on the target along the path of the beam, said second means including means for providing a constant signal offset.

* * * * *

UNITED STATES PATENT AND TRADEMARK OFFICE
CERTIFICATE OF CORRECTION

PATENT NO. : 4,593,200

DATED : June 3, 1986

INVENTOR(S) : Edward L. McGuire, III.

It is certified that error appears in the above-identified patent and that said Letters Patent is hereby corrected as shown below: On the Title page:

Under "Other Publications", the first title should read, "Optimal Selection of Scanning Frequencies in Ion Implantation Systems With X-Y Scanning".

Column 1, line 43, after "increases", add a period.

In Fig. 3, the sawtooth waveform adjacent to emplifier 42 should be parabolic as shown below.

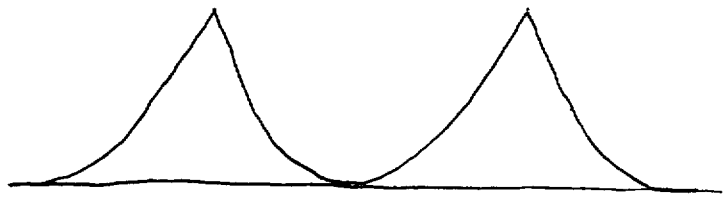

Signed and Sealed this

Seventh Day of April, 1987

Attest:

DONALD J. QUIGG

Attesting Officer

Commissioner of Patents and Trademarks